(12) United States Patent
Rohani et al.

(10) Patent No.: US 7,649,407 B2
(45) Date of Patent: Jan. 19, 2010

(54) DIGITALLY TUNED, INTEGRATED RF FILTERS WITH ENHANCED LINEARITY FOR MULTI-BAND RADIO APPLICATIONS

(75) Inventors: Nader Rohani, Scottsdale, AZ (US); Hongtao Xu, Beaverton, OR (US); Yulin Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 11/904,866

(22) Filed: Sep. 28, 2007

(65) Prior Publication Data

US 2009/0085818 A1   Apr. 2, 2009

(51) Int. Cl.
*H03B 1/00* (2006.01)
*H03K 5/00* (2006.01)
*H04B 1/10* (2006.01)

(52) U.S. Cl. .................. 327/553; 327/552; 333/172

(58) Field of Classification Search ............. 327/552, 327/553; 333/172
See application file for complete search history.

(56) References Cited

U.S. PATENT DOCUMENTS

| | | | | |
|---|---|---|---|---|
| 1,957,752 A * | 5/1934 | Avery | .......................... | 455/341 |
| 4,087,757 A * | 5/1978 | Cunningham | ............... | 334/40 |
| 5,032,839 A * | 7/1991 | Even-Or | ...................... | 342/15 |
| 5,041,745 A * | 8/1991 | Raso | ........................... | 327/50 |
| 6,298,046 B1 * | 10/2001 | Thiele | ........................ | 370/282 |
| 6,404,276 B1 * | 6/2002 | Liu | ............................ | 327/553 |
| 6,686,809 B2 * | 2/2004 | Nystrom et al. | ............ | 333/17.1 |
| 6,813,484 B1 * | 11/2004 | Tolson | ........................ | 455/307 |
| 6,842,069 B2 * | 1/2005 | Takahashi et al. | ........... | 327/552 |
| 7,092,678 B2 * | 8/2006 | Shih | ............................. | 455/78 |
| 7,109,781 B2 * | 9/2006 | Vorenkamp et al. | ......... | 327/513 |
| 7,245,186 B2 * | 7/2007 | Chang et al. | ................. | 330/302 |
| 7,260,368 B1 * | 8/2007 | Blumer | ....................... | 455/108 |
| 7,301,392 B2 * | 11/2007 | Hinrichs et al. | ............. | 327/553 |
| 7,339,442 B2 * | 3/2008 | Godambe | ................... | 331/135 |
| 7,446,600 B2 * | 11/2008 | Kosai | .......................... | 327/553 |
| 7,471,142 B2 * | 12/2008 | Li et al. | ...................... | 327/552 |
| 2004/0210790 A1 * | 10/2004 | Moon et al. | ................. | 713/500 |
| 2006/0209216 A1 * | 9/2006 | Okuma | ....................... | 348/725 |
| 2006/0273870 A1 * | 12/2006 | Yeung et al. | ................ | 333/204 |
| 2007/0064663 A1 * | 3/2007 | Dahlfeld | ..................... | 370/338 |
| 2007/0161357 A1 * | 7/2007 | Tudosoiu et al. | ............ | 455/129 |
| 2007/0200628 A1 * | 8/2007 | Leete | .......................... | 330/254 |
| 2008/0008320 A1 * | 1/2008 | Hinton et al. | ............... | 380/263 |
| 2008/0136473 A1 * | 6/2008 | Bollenbeck et al. | ......... | 327/156 |
| 2008/0238626 A1 * | 10/2008 | Rofougaran et al. | ....... | 340/10.1 |
| 2009/0002915 A1 * | 1/2009 | Ayazi et al. | ................. | 361/287 |

FOREIGN PATENT DOCUMENTS

JP          04234211 A  *  8/1992

* cited by examiner

*Primary Examiner*—Lincoln Donovan
*Assistant Examiner*—Adam D Houston
(74) *Attorney, Agent, or Firm*—The Law Offices of John C. Scott, LLC; John C. Scott

(57) ABSTRACT

An integrated, multi-band radio frequency (RF) filter is capable of modifying a filter response thereof in response to control information. Switching elements within the filter can be changed between on and off conditions to modify the filter response. In one implementation, the integrated, multi-band filter is integrated on a front end module chip to be used within a multi-radio wireless device. In at least one embodiment, linearity enhancement circuitry is provided within a multi-band filter to improve linearity and reduce insertion loss.

14 Claims, 6 Drawing Sheets

DIGITALLY TUNED, INTEGRATED RF FILTERS WITH ENHANCED LINEARITY FOR MULTI-BAND RADIO APPLICATIONS

TECHNICAL FIELD

The invention relates generally to radio frequency filters and, more particularly, to techniques for providing filters that can be tuned for operation within multiple different frequency bands.

BACKGROUND OF THE INVENTION

Many modern communication and computing devices support wireless communication for multiple different wireless standards. For example, a laptop computer may support wireless networking in accordance with both the IEEE 802.11b,g and IEEE 802.16 wireless networking standards. Often, the various supported standards will involve different operational frequency bands. Typically, separate circuitry would be provided within a device for each of the supported standards. It would be beneficial if one or more circuit components could be shared by multiple different wireless standards to, for example, reduce circuit size and/or cost.

DETAILED DESCRIPTION

Figure 2:
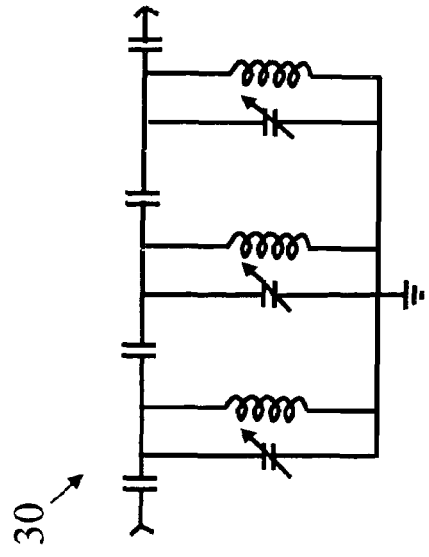
FIGS. 1, 2, 3, and 4 are schematic diagrams illustrating example bandpass filter architectures that may be used in accordance with embodiments of the present invention.
Figure 4:
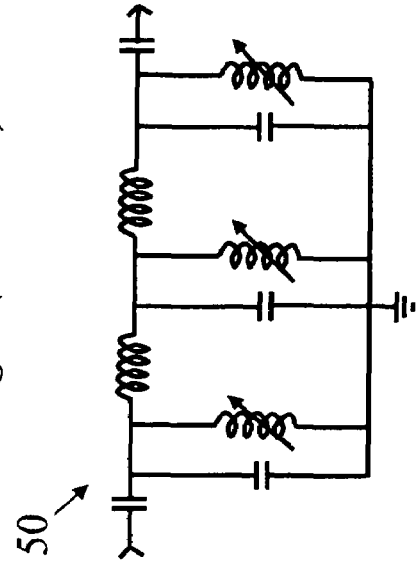
Figure 1:
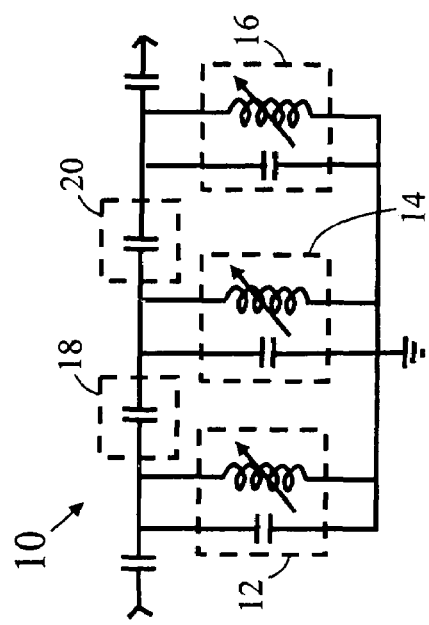
Figure 3:
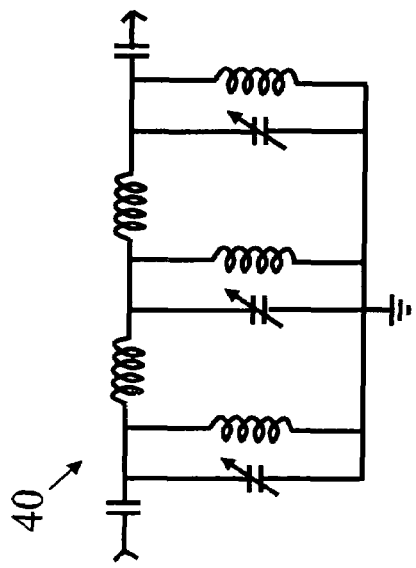

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to tunable, multi-band filters that can be implemented on-chip within, for example, radio frequency (RF) front end modules (FEMs) and/or other RF and mixed-signal chips. In one possible application, the tunable, multi-band filters may be used in devices and systems that support multiple different wireless standards. That is, the filter can be digitally switched between filter responses associated with multiple different wireless technologies so that a single filter structure may be used to support multiple radios. In the past, multi-band radio devices typically used a separate, off-chip filter for each of the corresponding radios. As will be appreciated, these separate filters may be costly to implement and consume much space within the corresponding device. By implementing the filters on-chip, circuit implementation size and cost can be reduced considerably. As will be described in greater detail, in at least one embodiment, a tunable filter is provided that includes dynamic bias control to improve linearity and reduce insertion loss.

FIGS. 1, 2, 3, and 4 are schematic diagrams illustrating example bandpass filter architectures 10, 30, 40, 50 that may be used in accordance with embodiments of the present invention. Each filter architecture 10, 30, 40, 50 includes a number of tunable LC tank circuits that are interconnected with series coupling elements. For example, filter 10 of FIG. 1 includes capacitors 18, 20 as series coupling elements between tunable tank circuits 12, 14, and 16. The tunable tank circuits in the filter architectures 10, 30, 40, 50 each have at least one reactive element that can be changed in value during circuit operation to change a corresponding response of the filter. For example, the tunable tank circuits 12, 14, and 16 of FIG. 1 each include variable inductances for use in changing the filter response. In this manner, the filter 10 of FIG. 1 uses capacitive coupling and inductive tuning, the filter 30 of FIG. 2 uses capacitive coupling and capacitive tuning, the filter 40 of FIG. 3 uses inductive coupling and capacitive tuning, and the filter 50 of FIG. 4 uses inductive coupling and inductive tuning. In other embodiments, more than one of the parallel branches within each tank circuit in a filter may be tunable. Similarly, in some embodiments, the coupling elements are also tunable. Other filter architectures may also be used in accordance with embodiments of the invention.

In at least one embodiment of the invention, filter tunability is achieved using switching mode transistors and on-chip inductors and capacitors. Techniques for achieving fixed-value inductances and capacitances "on-chip" are well known in the art. To change the response of a filter, the switching mode transistors therein may be switched between on and off states. The change in the states of the switches will modify the values of the inductances and capacitances within the filter in a manner that changes the filter response in a desired way. In at least one embodiment, the parasitic capacitances of the "off" state transistors may be used as tuning elements within a filter to generate a desired filter response.

Figure 5:
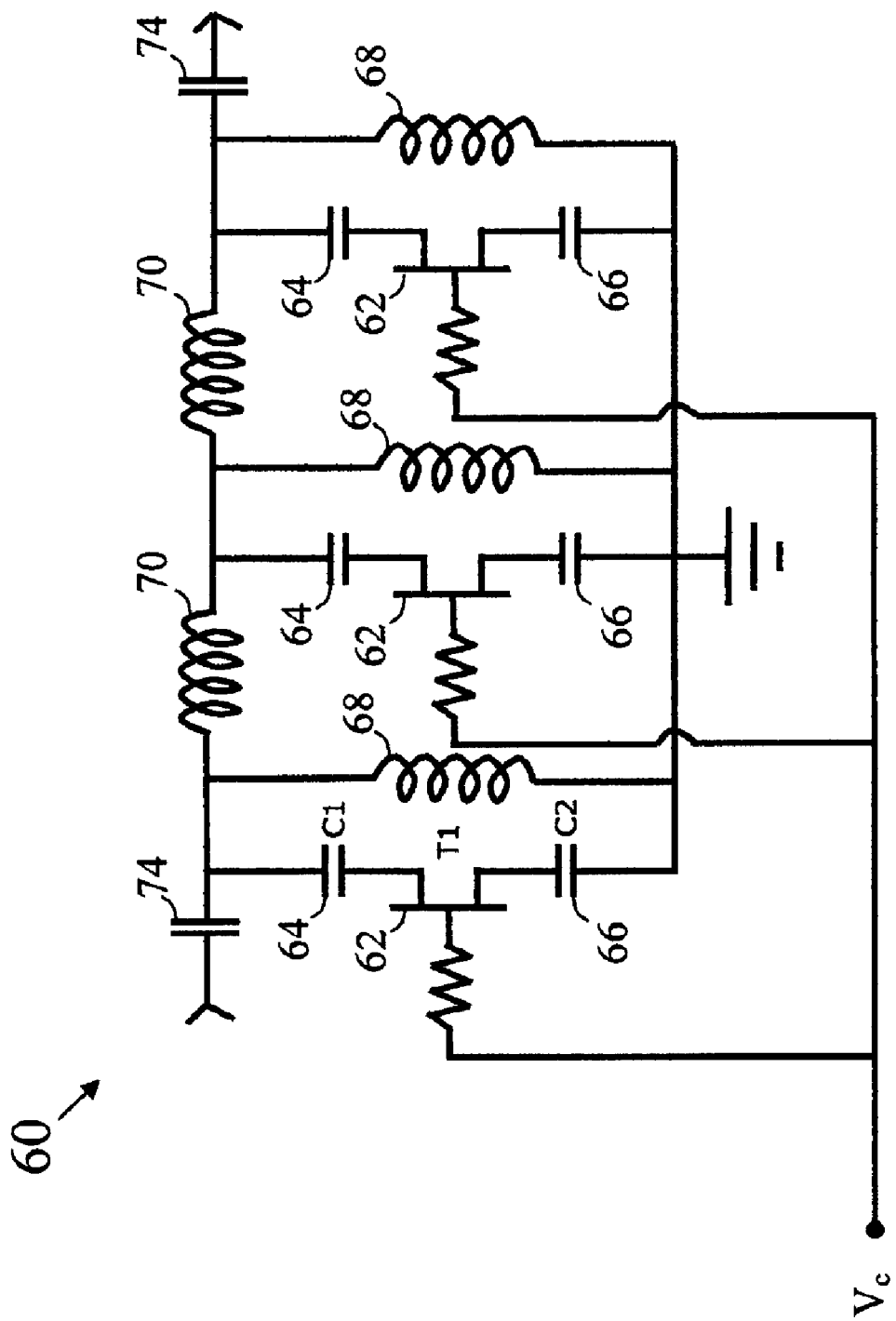
FIG. 5 is a schematic diagram illustrating an example tunable, multi-band filter in accordance with an embodiment of the present invention.

FIG. 5 is a schematic diagram illustrating an example tunable, multi-band filter 60 in accordance with an embodiment of the present invention. Like the filter 40 of FIG. 3, the tunable, multi-band filter 60 of FIG. 5 uses inductive coupling and capacitive tuning. As shown, the filter 60 includes multiple tunable tank circuits that each include: a switching transistor 62, first and second capacitors 64, 66, and an inductor 68. The first and second capacitors 64, 66 and the transistor 62 are located in one branch of each tank and the inductor 68 is located within another, parallel branch of each tank. The switching transistor 62 may include any type of transistor that can switch between on and off states (e.g., FET, CMOS, pHEMT, etc.). The filter 60 also includes two coupling inductors 70. A DC blocking capacitor 74 is located at both the input and the output of the filter 60.

The filter 60 is operative for covering two different operational frequency bands. These two bands may be associated with, for example, two different wireless standards being supported by a multi-radio device (e.g., IEEE 802.11 and IEEE 802.16, etc.). In one filter state, all of the switching transistors 62 will be biased "on" and, in the other filter state, all of the switching transistors 62 will be biased "off." The biasing may be carried out using control voltage $V_C$ applied to the gate terminals of the switching transistors 62. To bias the transistors 62 "on," a voltage level of $V_{CC}$ (the supply voltage) may be applied to the gate terminals of the transistors. To bias the transistors "off," a voltage level of zero may be applied to the gate terminals of the transistors.

When the switching transistor 62 within each tank is on, the transistor 62 appears as a small "on" resistance between its drain and source terminals. To a first approximation, ignoring the "on" resistance of the transistor, the total capacitance ($C_T$) of the tank is the series combination of $C_1$ and $C_2$ or $C_T = C_1 C_2 / (C_1 + C_2)$ when the transistor is biased on. The capacitance values of $C_1$ and $C_2$, as well as the inductance values of the inductors 68, 70, will be selected to achieve a first desired band pass filter response when the switching transistors 62 are on. When the switching transistor 62 within each tank circuit is biased off, the transistor 62 appears as a parasitic capacitance $C_P$ within the tank circuit. The parasitic "off" capacitance is the total parasitic capacitance between the drain and source, the drain and ground, and the source and ground. The capacitance values of the first and second capacitors 64, 66 will have negligible effect on the filter response when the switching transistor 62 is off. The value of the parasitic capacitance $C_P$, as well as the inductance values of the inductors 68, 70, will be selected to achieve a second desired band pass filter response when the switching transistors 62 are off. The size of the switching transistor 62 will typically determine both the off state parasitic capacitance and the on state resistance. Therefore, given the capacitance tuning ratio dictated by the dual band frequency, the transistor size and the values of $C_1$ and $C_2$ can be optimized to maximize the Q factor of the circuit.

In the above described embodiment, the tunable, multi-band filter 60 is capable of operating within two different desired bands. In other embodiments, filters that are capable of switching between three or more different filter responses are provided. In one approach, for example, tunability may be extended by adding more tunable elements in parallel to a fixed element. The number of bands that can be covered will thus be a binary function of the number to tunable elements that are placed in parallel with the fixed element. For example, in the filer 60 discussed above, there is one tunable element in parallel with one fixed element per tank, thus giving two total bands to select between. If there are two tunable elements in parallel with the fixed element, then there will be 4 bands to select between. If there are three tunable elements in parallel with the fixed element, there will be 8 bands to select between, and so on. Other techniques for increasing the number of tunable bands also exist.

As described above, the filter 60 of FIG. 5 includes three individual tank circuits. In other embodiments, a higher or lower number of tank circuits may be used. In addition, the filter 60 of FIG. 5 includes two parallel branches within each of the tank circuits. In other embodiments, one or more additional parallel branches may be added to each tank circuit. For example, in the filter 60 of FIG. 5, an additional branch having a capacitor may be added to each tank circuit. In such an embodiment, the overall capacitance of the tank will include a parallel combination of the capacitances of the two capacitive branches.

In high power RF applications, such as an IEEE 802.16 radio, it is very important to provide filters with a high level of linearity. This can be especially important within the post power amplifier filter in the RF transmitter of the radio. Non-linearities within the filter will typically be greatest within the switching transistors themselves. To address these non-linearities, in at least one embodiment of the present invention, a dynamic bias control technique is used to control the biasing of the switching transistors in a way that enhances linear operation and reduces insertion loss.

Figure 6:
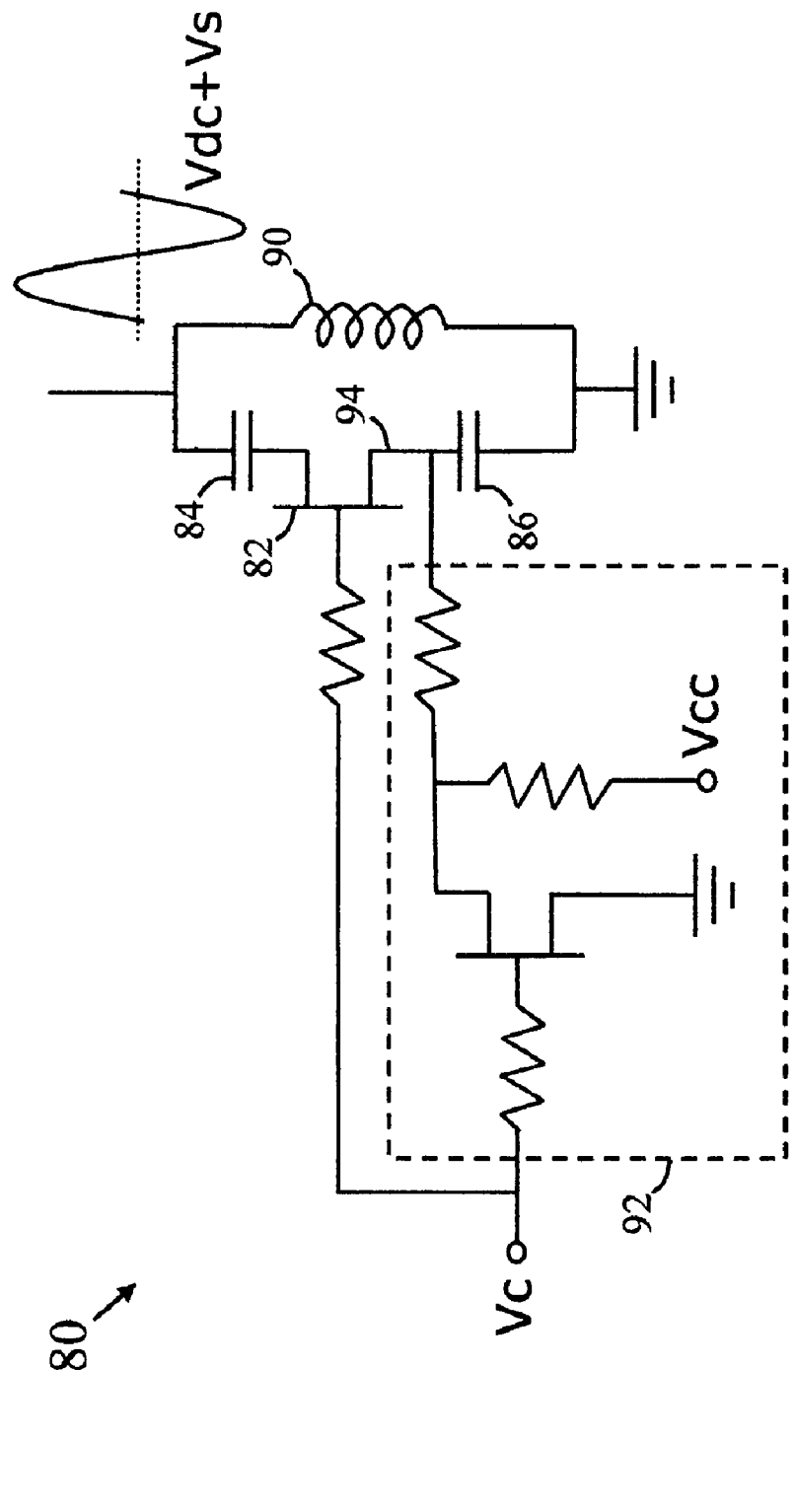
FIG. 6 is a schematic diagram illustrating an example tank circuit having linearity enhancement circuitry that may be used within a tunable, multi-band filter in accordance with an embodiment of the present invention.

FIG. 6 is a schematic diagram illustrating an example tank circuit 80 that may be used within a tunable, multi-band filter in accordance with an embodiment of the present invention. The tank circuit 80 includes linearity enhancement circuitry that is capable of reducing non-linearities within the tank circuit 80 that can distort a signal being filtered. The tank circuit 80 may be used within any of the filters in FIGS. 1-5 or in other filters. As illustrated, the tank circuit 80 includes a switching transistor 82, first and second capacitors 84, 86, a fixed inductor 90, and an inverter 92. As described previously, a control voltage $V_C$ is applied to the gate terminal of the switching transistor 82 to turn the transistor on and off to change the filter response of the associated filter.

The linearity of a filter using the tank circuit 80 of FIG. 6 will typically depend upon the linearity of the switching transistor 82 of the tank. This is because the linear amplitude of the signal passing through the filter will often be limited by the maximum linear voltage swing across the "off" state switching transistor. To maximize linearity, the value of $|V_g - V_s|$ should be maximized to the power supply voltage level $V_{CC}$, where $V_g$ and $V_s$ are voltages applied to the transistor gate and source, respectively. This may be realized by causing the source bias voltage of the switching transistor 82 to follow an inverted version of the gate control voltage $V_C$. As shown in FIG. 6, in one possible implementation, an inverter 92 may be provided to invert the gate control voltage $V_C$ and apply the inverted signal to the source terminal 94 of the switching transistor 82. In the illustrated embodiment, the inverter 92 comprises a field effect transistor (FET) connected in a common source configuration. Other types of inverter circuits may alternatively be used. When the switching transistor 82 is to be turned on, a logic high voltage (e.g., $V_{CC}$) is applied to the gate thereof and a logic low voltage (e.g., zero volts) is applied to the source terminal 94 by the inverter 92. This effectively minimizes the on state resistance of the switching transistor 82 which translates into reduced filter insertion loss. When the switching transistor 82 is to be turned off, a logic low voltage is applied to the gate terminal of the transistor and a logic high voltage is applied to the source terminal 94 by the inverter 92. As described above, this maximizes the allowable voltage swing of the off state transistor, thereby improving circuit linearity.

Figure 7:
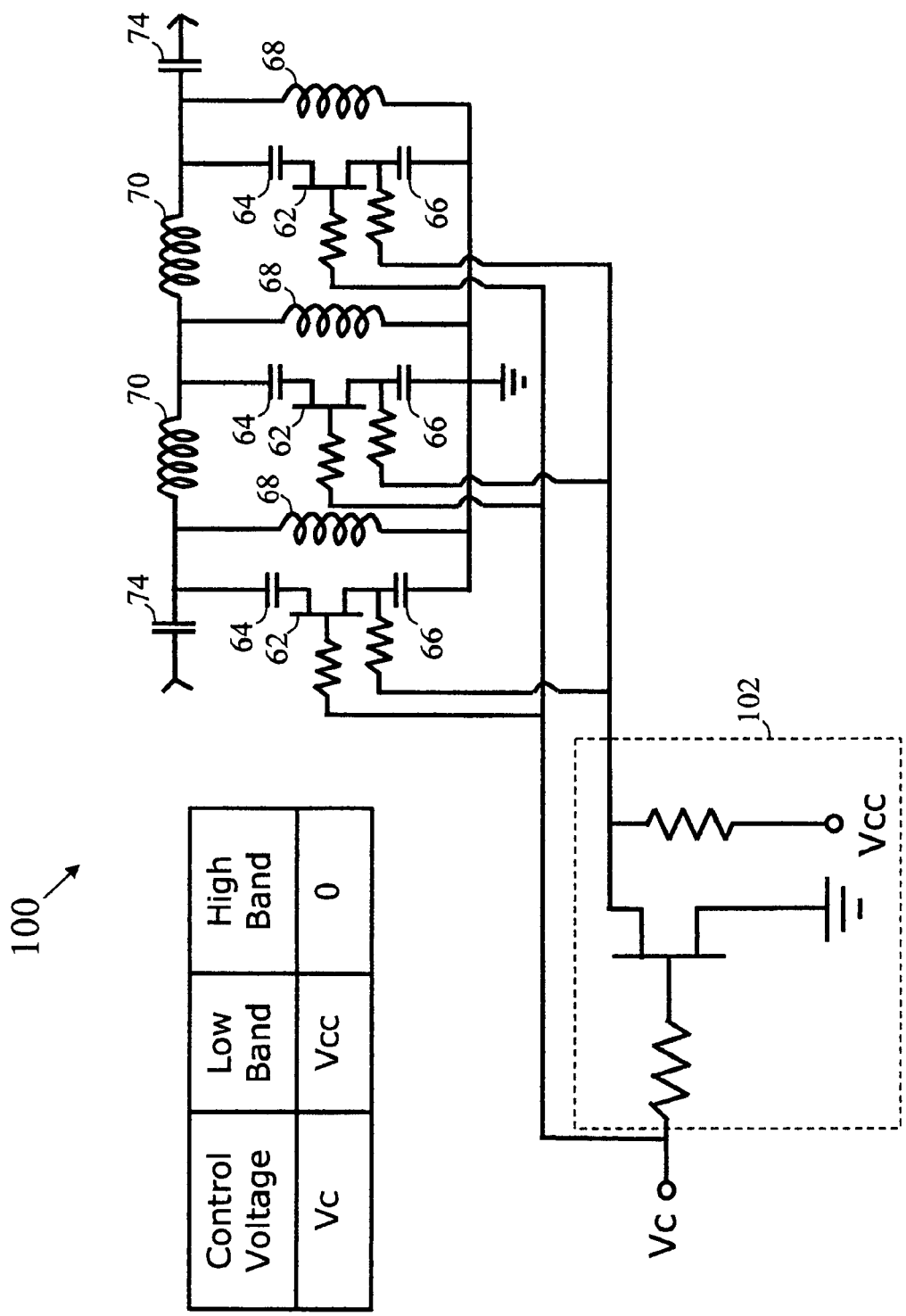
FIG. 7 is a schematic diagram illustrating an example tunable, multi-band bandpass filter having linearity enhancement circuitry in accordance with an embodiment of the present invention.

FIG. 7 is a schematic diagram illustrating an example tunable, multi-band band pass filter 100 that includes linearity enhancement circuitry in accordance with an embodiment of the present invention. The filter 100 uses the same overall architecture as the filter 60 of FIG. 5, but adds linearity enhancement circuitry, such as that shown in FIG. 6. A gate control voltage $V_C$ is applied to the gates of three switching transistors 62 to change the transistors between on and off states. An inverter 102 inverts the gate control signal and applies the inverted signal to the source terminals of the transistor 62 within each tank circuit. As described previously, the inverted signal is applied to improve the linearity of the filter and also to reduce insertion loss. The filter 100 is operative within both a higher frequency band and a lower frequency band. When the higher frequency band is desired, a voltage of zero is applied to the gate terminals of the switching transistors 62 and a voltage of $V_{CC}$ is applied to the source terminals by the inverter 102. When the lower frequency band is desired, a voltage of $V_{CC}$ is applied to the gate terminals of the switching transistors 62 and a voltage of zero is applied to the source terminals by the inverter 102. In at least one implementation, the same transistor technology is used to provide the transistor within the inverter 102 that is used to provide the switching transistors 62 (e.g., FETs, CMOS, pHEMT, etc.). This approach facilitates the implementation of the filter circuitry on chip.

In at least one embodiment of the invention, one or more of the tunable, multi-band filters are provided on-chip within a wireless front-end module (FEM). Embodiments within other types of RF chip and within mixed signal chips also exist. The filters may also be provided as separate tunable filter chips that can then be coupled to other chips or circuits. Features of the invention may be used to provide any type of filter response including, for example, bandpass, bandstop, high pass, and low pass. Filters in accordance with the present invention may be used within RF transmitters, RF RF receivers, and/or in other RF circuits.

As described previously, in at least one embodiment of the invention, one or more tunable, multi-band filters are used within a multi-radio device that includes radios following two or more different wireless standards. In this manner, a filter can be designed to achieve two or more distinct filter responses for use with the different wireless standards. When a multi-band radio device is about to use a particular wireless technology (e.g., IEEE 802.16 wireless networking), digital control signals may be delivered to the filter units within the transceiver circuitry to appropriately configure the filters. Communication may then be allowed to proceed in a normal manner. Other applications for the tunable, multi-band filters also exist.

Figure 8:
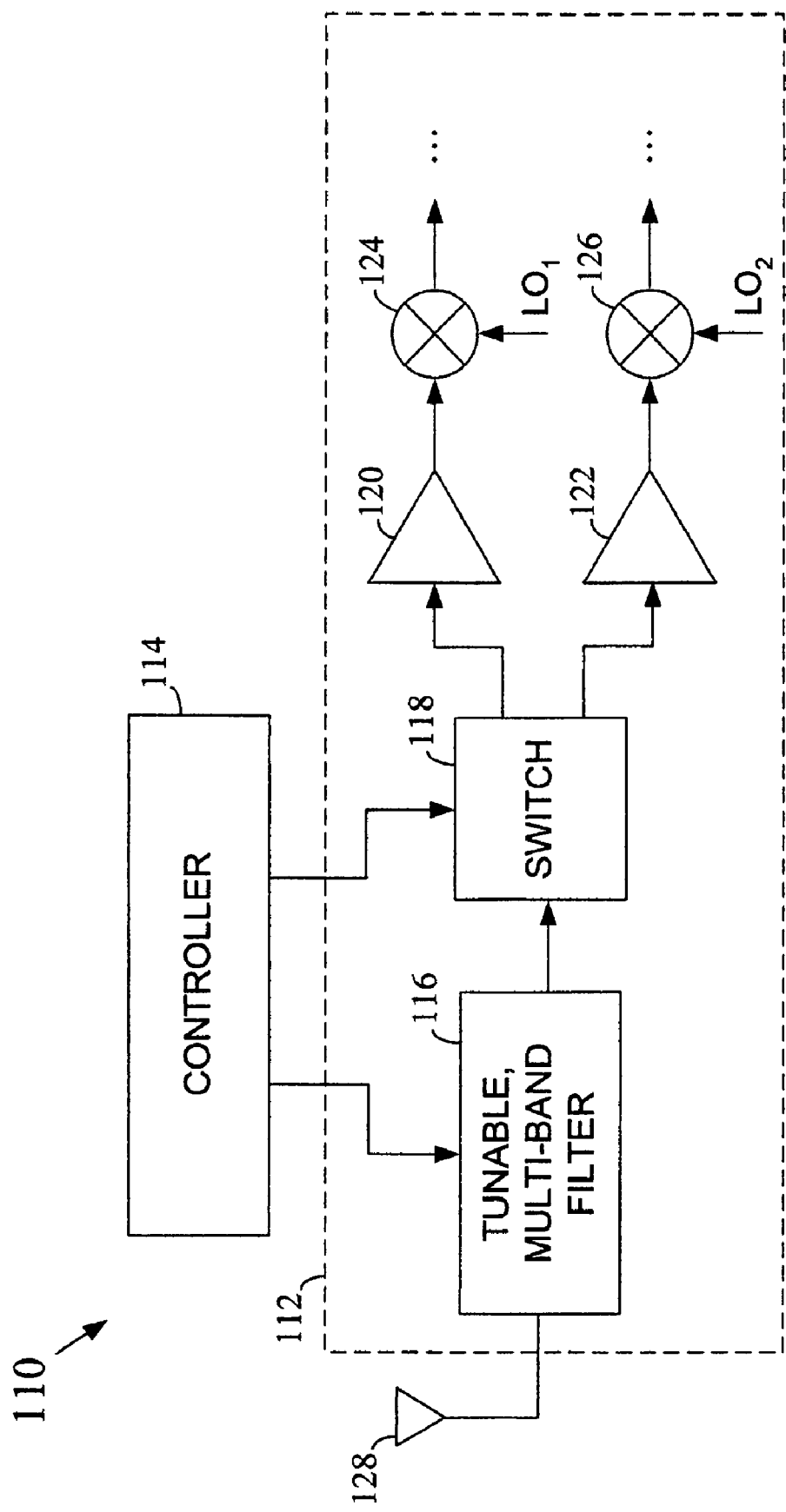
FIG. 8 is a block diagram illustrating an example multi-band receiver that includes a tunable, multi-band filter in accordance with an embodiment of the present invention.

FIG. 8 is a block diagram illustrating an example multi-band receiver 110 that includes a tunable, multi-band filter in accordance with an embodiment of the present invention. As illustrated, the wireless device 110 includes a radio frequency front end module (FEM) 112 that is coupled to a controller 114. The FEM 112 is also coupled to one or more antennas 128. Any type of antenna may be used including, for example, a dipole, a patch, a helical antenna, an antenna array, and/or others. In at least one embodiment, the antenna 128 is implemented as part of the FEM 112. The FEM 112 includes receiver circuitry to support two different wireless standards that use different frequency bands. As shown in FIG. 8, the FEM 112 includes: a tunable, multi-band filter 116, a switch 118, first and second low noise amplifiers (LNAs) 120, 122, and first and second mixers 124, 126. Although not shown, additional receiver circuitry may also be implemented on the FEM 112. The first LNA 120 and the first mixer 124 are associated with one of the supported wireless standards and the second LNA 122 and the second mixer 126 are associated with the other supported standard. The switch 118 is operative for directing a received signal to appropriate receive circuitry when received. The tunable, multi-band filter 116 acts as a preselector to filter a received signal to reject signal energy outside of a desired band.

The controller 114 may configure the filter 116 by sending control signals thereto based on the wireless standard that is currently active for the multi-band receiver 110. The controller 114 may also configure the switch 118 to direct the filtered signal to the proper receive channel. One of the LNAs 120, 122 will receive the signal from the switch 118 and amplify the signal in a low noise manner. The corresponding mixer 124, 126 will then down convert the signal to an intermediate frequency or to baseband. Additional receive processing may then occur.

Figure 9:
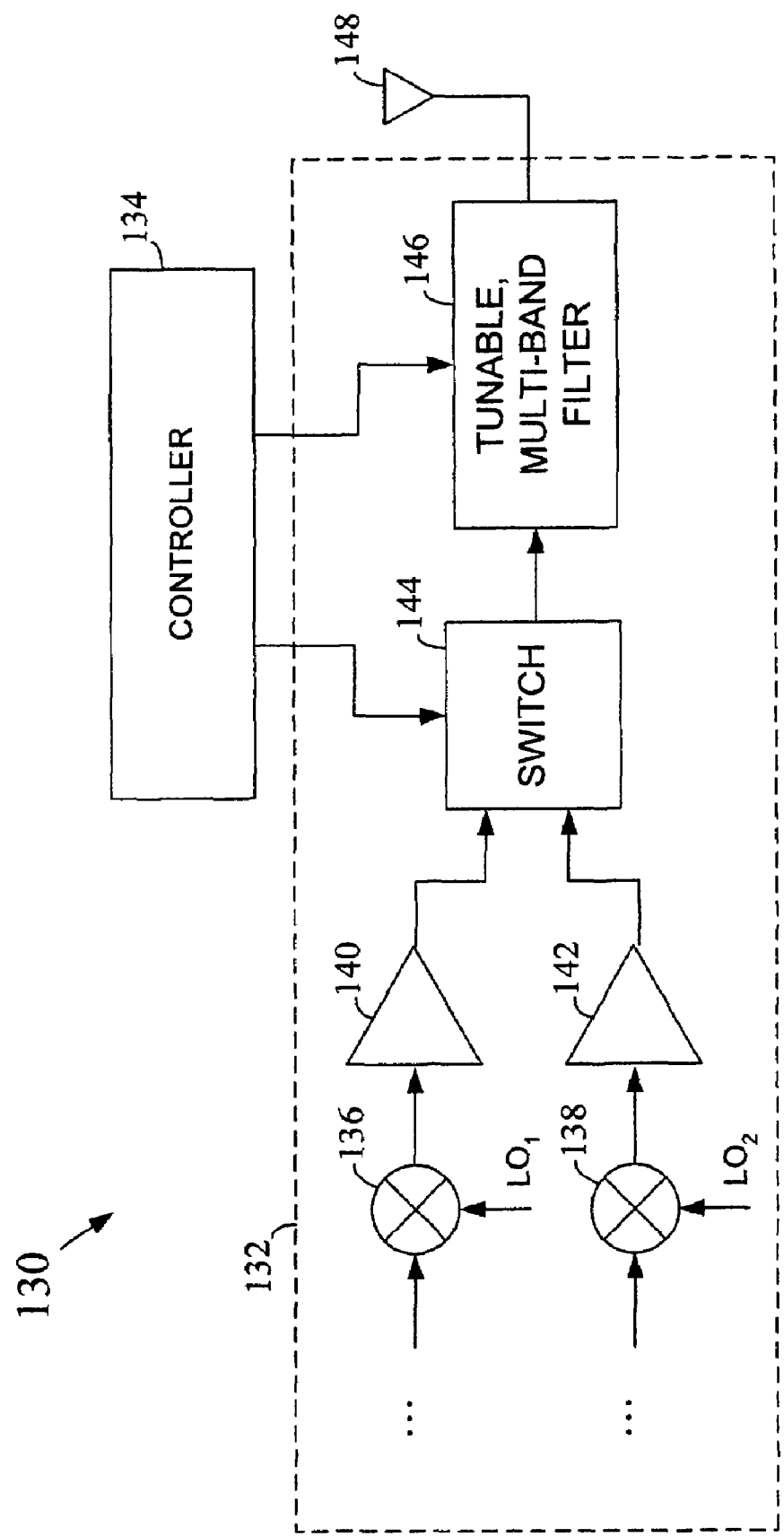
FIG. 9 is a block diagram illustrating an example multi-band transmitter that includes a tunable, multi-band filter in accordance with an embodiment of the present invention.

FIG. 9 is a block diagram illustrating an example multi-band transmitter 130 that includes a tunable, multi-band filter in accordance with an embodiment of the present invention. As illustrated, the multi-band transmitter 130 is part of a radio frequency front end module (FEM) 132 that is coupled to a controller 134. The FEM 132 is also coupled to one or more antennas 148. As before, any type of antenna may be used including, for example, a dipole, a patch, a helical antenna, an antenna array, and/or others. The FEM 132 includes: first and second mixers 136, 138, first and second power amplifiers 140, 142, a switch 144, and a tunable, multi-band filter 146. The first mixer 136 and the first power amplifier 140 are associated with one of the supported wireless standards and the second mixer 138 and the second power amplifier 142 are associated with the other supported standard. Each mixer 136, 138 are operative for up converting transmit signals to appropriate transmit frequencies during transmit operations. The corresponding power amplifier 140, 142 then amplifies the signal to a desired transmit power level. Depending on which radio is transmitting, the controller 134 will cause the switch 144 to couple either the first power amplifier 140 or the second power amplifier 142 to the tunable, multi-band filter 146. The controller 134 will also send control signals to the tunable, multi-band filter 146 to configure the filter for the corresponding filter response. The filtered transmit signal is then delivered to the antenna(s) 148 for transmission.

It should be appreciated that the multi-radio wireless devices of FIGS. 8 and 9 represent two possible applications of a tunable, multi band filter in accordance with the present invention. Many other applications also exist. For example, the filters may be integrated onto FEMs having entirely different architectures. The filters may also be implemented on other type of chips or in additional or alternative locations on a chip. As described previously, in some embodiments, filters are used that are operative within three or more different operational frequency bands. Implementation as a separate filter chip is also possible.

The techniques and structures of the present invention may be implemented in any of a variety of different forms. For example, features of the invention may be embodied within laptop, palmtop, desktop, and tablet computers having wireless capability; personal digital assistants (PDAs) having wireless capability; cellular telephones and other handheld wireless communicators; pagers; satellite communicators; cameras having wireless capability; audio/video devices having wireless capability; network interface cards (NICs) and other network interface structures; base stations; wireless access points; integrated circuits; and/or in other formats.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A tunable, multi-band filter comprising:
a tank circuit that includes at least two parallel branches, wherein a first branch of said at least two parallel branches includes a switching transistor and a second branch of said at least two parallel branches includes a fixed inductor, wherein said gate terminal of said switching transistor is coupled to receive a control voltage $V_C$ to tune said filter between multiple different filter responses; and
an inverter to invert said control voltage $V_C$ and apply said inverted signal to a source terminal of said switching transistor to improve the linearity of said filter;
wherein said tank circuit and said inverter are integrated on a semiconductor chip; and
wherein said switching transistor includes a parasitic off capacitance when it is in the off state that is used as a reactive element within the filter to achieve a desired filter response when the switching transistor is in the off state.

2. The tunable, multi-band filter of claim 1, further comprising:
a second tank circuit that includes at least two parallel branches, wherein a first branch of said at least two parallel branches of said second tank circuit includes a second switching transistor and a second branch of said at least two parallel branches of said second tank circuit includes a fixed inductor, wherein said gate terminal of said second switching transistor is coupled to receive said control voltage $V_C$ to tune said filter between multiple different responses and said inverter applies said inverted signal to a source terminal of said second switching transistor to improve the linearity of said filter; and
at least one series reactive element coupling said first and second tank circuits.

3. The tunable, multi-band filter of claim 1, wherein:
said first branch of said tank circuit further includes a first capacitor coupled to a drain terminal of said switching transistor and a second capacitor coupled to a source terminal of said switching transistor.

4. The tunable, multi-band filter of claim 1, wherein:
said semiconductor chip is a front end module.

5. The tunable, multi-band filter of claim 1, wherein:
said semiconductor chip is a dedicated filter chip.

6. A system comprising:
at least one dipole antenna; and
a semiconductor chip coupled to said at least one dipole antenna, said semiconductor chip having a tunable, multi-band filter integrated thereon, said tunable, multi-band filter comprising:
a switching transistor having a gate terminal that is coupled to receive a control voltage $V_C$ to tune said tunable, multi-band filter between multiple different responses; and
an inverter to invert said control voltage $V_C$ and apply said inverted signal to a source terminal of said switching transistor to improve the linearity of said filter;
wherein said semiconductor chip further includes first radio circuitry operative within a first frequency band and second radio circuitry operative within a second frequency band, wherein both said first radio circuitry and said second radio circuitry are coupled to said tunable, multi-band filter.

7. The system of claim 6, further comprising:
a controller to cause control signals to be delivered to said tunable, multi-band filter to change a filter response thereof.

8. The system of claim 6, wherein:
said switching transistor is within a first branch of a first tank circuit of said tunable, multi-band filter, said first tank circuit also including a second branch having a fixed inductor; and
said tunable, multi-band filter further includes:
a second tank circuit having at least a first and second branch, said first branch of said second tank circuit having a second switching transistor and said second branch of said second tank circuit having a fixed inductor, said second switching transistor having a gate terminal that is coupled to receive said control voltage $V_C$ and a source terminal that is coupled to receive said inverted signal from said inverter; and
at least one series reactive element coupling said first and second tank circuits.

9. The system of claim 8, wherein:
said first branch of said tank circuit further includes a first capacitor coupled to a drain terminal of said switching transistor and a second capacitor coupled to a source terminal of said switching transistor.

10. The system of claim 6, wherein:
said switching transistor includes a parasitic off capacitance when it is in the off state, wherein said parasitic off capacitance of said switching transistor is used as a reactive element within the filter to achieve a desired filter response when the switching transistor is in the off state.

11. The system of claim 6, wherein:
said semiconductor chip is a front end module.

12. A computer implemented method comprising:
providing a control voltage signal to a gate terminal of a first switching transistor within a tunable, multi-band filter to change said filter between multiple different filter responses; and
providing an inverted version of said control voltage signal to a source terminal of said first switching transistor to improve the linearity of said tunable, multi-band filter;
wherein said first switching transistor is within a first branch of a first tank circuit of said tunable, multi-band filter, said first tank circuit also including a second branch having a fixed inductor, wherein said first branch of said first tank circuit further includes a first capacitor coupled to a drain terminal of said first switching transistor and a second capacitor coupled to a source terminal of said first switching transistor.

13. The method of claim 12, further comprising:
providing said control voltage signal to a gate terminal of a second switching transistor within said tunable, multi-band filter, at the same time that said control voltage signal is provided to said gate terminal of a first switching transistor, to change said filter between multiple different filter responses; and
providing said inverted version of said control voltage signal to a source terminal of said second switching transistor, at the same time that said inverted version of said control voltage signal is provided to said source terminal of a first switching transistor, to improve the linearity of said tunable, multi-band filter.

14. The method of claim 13, wherein:
said first switching transistor includes a parasitic off capacitance when it is in the off state, wherein said parasitic off capacitance of said switching transistor is used as a reactive element within the tunable, multi-band filter to achieve a desired filter response when the switching transistor is in the off state.

* * * * *